(12) United States Patent
Yoshino (10) Patent No.: US 9,385,057 B2
(45) Date of Patent: Jul. 5, 2016

(54) SEMICONDUCTOR DEVICE (71) Applicant: SEIKO INSTRUMENTS INC., Chiba-shi, Chiba (JP)

(72) Inventor: Tomoyuki Yoshino, Chiba (JP)

(73) Assignee: SII Semiconductor Corporation (JP)

( * ) Notice: Subject to any disclaimer, the term of this patent is extended or adjusted under 35 U.S.C. 154(b) by 61 days.

(21) Appl. No.: 14/485,927

(22) Filed: Sep. 15, 2014

(65) Prior Publication Data
US 2015/0076690 A1 Mar. 19, 2015

(30) Foreign Application Priority Data

Sep. 18, 2013 (JP) .................................. 2013-192964

(51) Int. Cl.
| | |
|---|---|
| H01L 23/48 | (2006.01) |
| H01L 23/52 | (2006.01) |
| H01L 29/40 | (2006.01) |
| H01L 23/28 | (2006.01) |
| H01L 21/56 | (2006.01) |
| H01L 21/78 | (2006.01) |
| H01L 23/00 | (2006.01) |
| H01L 23/495 | (2006.01) |
| H01L 23/498 | (2006.01) |
| H01L 21/48 | (2006.01) |

(52) U.S. Cl.
CPC ............ *H01L 23/28* (2013.01); *H01L 21/4821* (2013.01); *H01L 21/561* (2013.01); *H01L 21/568* (2013.01); *H01L 21/78* (2013.01); *H01L 23/49541* (2013.01); *H01L 23/49582* (2013.01); *H01L 23/49861* (2013.01); *H01L 24/97* (2013.01); *H01L 24/73* (2013.01); *H01L 2224/16245* (2013.01); *H01L 2224/32245* (2013.01); *H01L 2224/45139* (2013.01); *H01L 2224/48091* (2013.01); *H01L 2224/48247* (2013.01); *H01L 2224/73265* (2013.01); *H01L 2224/97* (2013.01); *H01L 2924/12042* (2013.01); *H01L 2924/181* (2013.01)

(58) Field of Classification Search
CPC ......... H01L 23/48; H01L 23/52; H01L 29/40; H01L 23/495; H01L 21/561
USPC .................................................... 257/676, 737
See application file for complete search history.

(56) References Cited

U.S. PATENT DOCUMENTS

| | | | | |
|---|---|---|---|---|
| 2008/0246132 | A1* | 10/2008 | Kasuya | ............... H01L 23/3121 257/676 |
| 2010/0013069 | A1* | 1/2010 | Kasuya | ................. H01L 21/561 257/676 |

OTHER PUBLICATIONS

Patent Abstracts of Japan, Publication No. 07-030043, Publication Date Jan. 31, 1995.
Patent Abstracts of Japan, Publication No. 08-213540, Publication Date Aug. 20, 1996.
Patent Abstracts of Japan, Publication No. 2002-009196, Publication Date Jan. 11, 2002.

* cited by examiner

*Primary Examiner* — Phuc Dang
(74) *Attorney, Agent, or Firm* — Adams & Wilks (57) ABSTRACT

A semiconductor flat package has a semiconductor chip, leads connected to the semiconductor chip, and an encapsulation resin covering the semiconductor chip and partially covering the leads. Outer end surfaces of the leads are exposed from the encapsulation resin and covered with a plated layer, and a side end surface of the plated layer and a side end surface of the encapsulation resin are flush with each other. A material with good solder wettability is formed at a lead cut portion of the semiconductor flat package, to thereby improve solder connection strength with a circuit board. A solder fillet is formed from the lead cut portion of the semiconductor package, to thereby enable adaptation of solder automatic visual inspection after mounting.

12 Claims, 10 Drawing Sheets

SEMICONDUCTOR DEVICE

BACKGROUND OF THE INVENTION

1. Field of the Invention

The present invention relates to a resin-encapsulated semiconductor device, and more particularly, to a so-called flat package semiconductor device having a flat lead so that a bottom surface of a semiconductor package and a bottom surface of the lead are flush with each other.

2. Description of the Related Art

Various electronic devices, including portable devices, are becoming thinner, smaller, and lighter. Semiconductor packages to be mounted on the electronic devices are also required to be thinner and smaller. Thinning and downsizing of the semiconductor package cannot be achieved by a related-art gullwing type semiconductor package. It is thus effective to employ a so-called flat package, which has a flat lead so that a bottom surface of the semiconductor package and a bottom surface of the lead are flush with each other.

In the flat package, a lead for connection to a circuit board is exposed from a rear surface of the package (surface to be mounted on the circuit board). Further, an island that is a portion for mounting a semiconductor chip thereon is generally formed of a lead frame, a plated layer, or the like, and the island is exposed from the rear surface of the package in some cases and not in other cases. In addition, in some semiconductor packages, no island is formed but a semiconductor chip is directly mounted on an encapsulation resin. When the flat package is mounted on a circuit board with solder, a bottom surface of an outer lead and a pattern of the circuit board are bonded to each other with solder.

A method of manufacturing a related-art flat package is described with reference to the drawings.

Figure 10A:
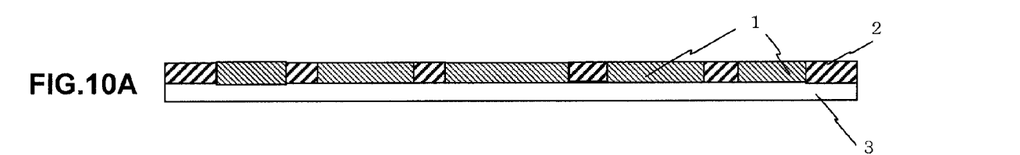
FIGS. 10A to 10G are cross-sectional views illustrating an example of a manufacturing process for a related-art semiconductor device.
Figure 10B:
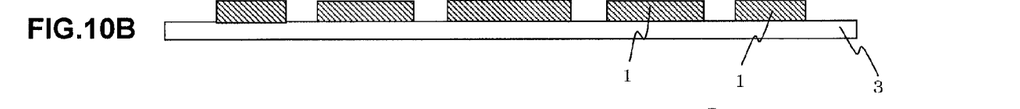
Figure 10C:
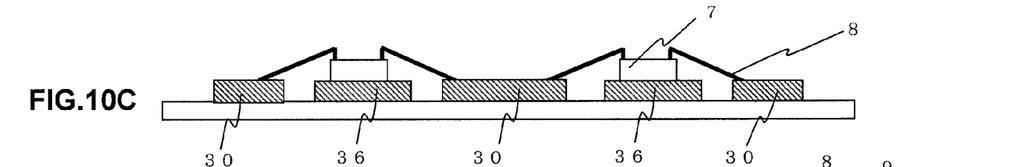
Figure 10D:
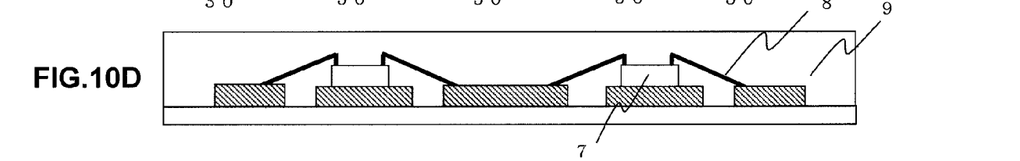
Figure 10E:
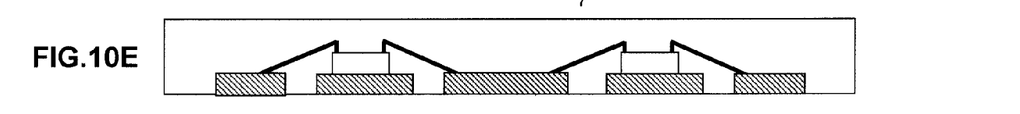
Figure 10F:
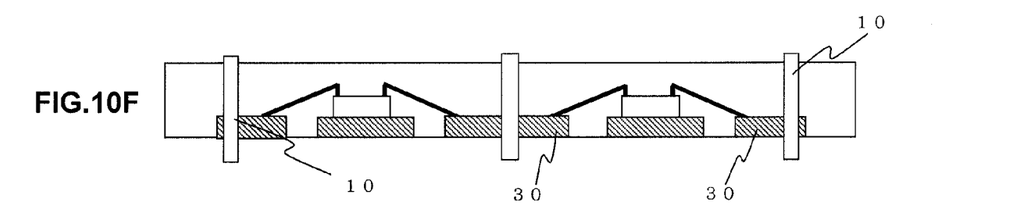
Figure 10G:
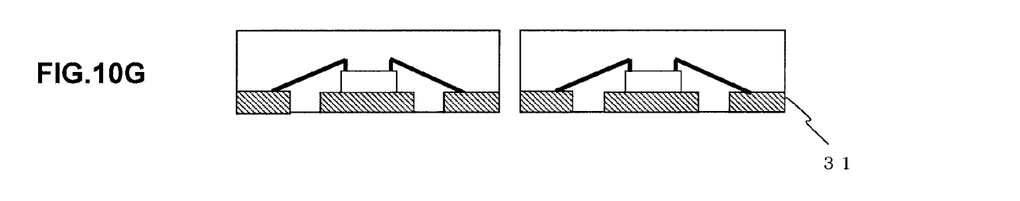

FIGS. 10A to 10G are cross-sectional views illustrating the method of manufacturing the related-art semiconductor package in the order of steps. Referring to FIG. 10A, a photo resist 2 is applied and patterned on a conductive base plate 3, and a plated layer 1 is formed in an opening of the photo resist 2 to form an electrode of the semiconductor package. The plated layer 1 is formed of three layers in many cases. A gold or silver plated layer is formed on the conductive base plate 3, a nickel or copper plated layer is formed thereon, and further a gold or silver plated layer is formed thereon. Referring to FIG. 10B, the photo resist 2 is removed. Referring to FIG. 10C, a semiconductor chip 7 is die-bonded on an island 36 formed of the plated layer 1, and a wire 8 is electrically connected to an outer lead 30 similarly formed of the plated layer 1. Referring to FIG. 10D, an encapsulation resin layer 9 is formed in order to protect the semiconductor chip 7, the wire 8, and the like. Referring to FIG. 10E, the conductive base plate 3 is removed. FIG. 10F illustrates dicing with a dicing blade 10 for singulating the semiconductor package. In dicing, the outer lead 30 formed of the plated layer 1 is cut. FIG. 10G illustrates the final cross section of the semiconductor package. An end surface 31 of the outer lead 30 is exposed.

Figure 11:
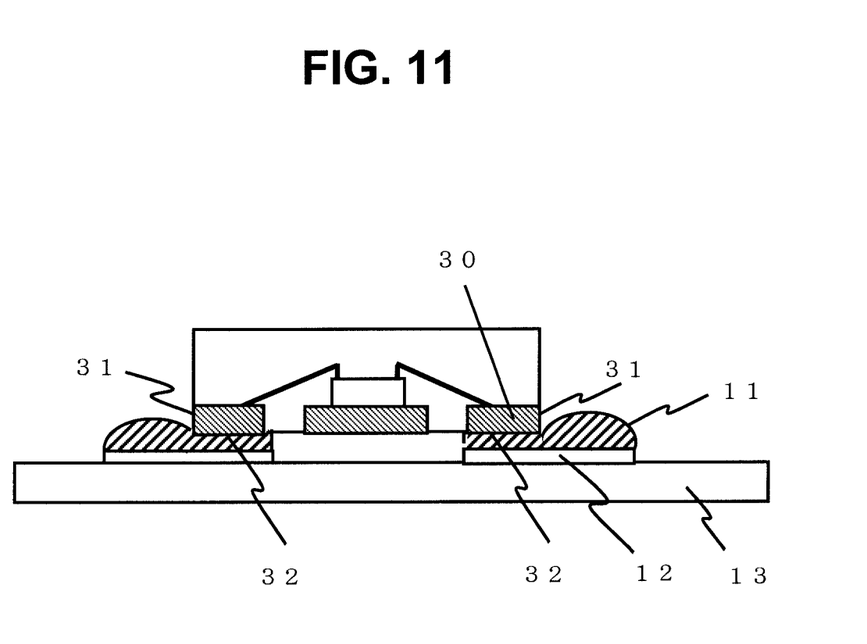
FIG. 11 is a cross-sectional view illustrating a state in which the related-art semiconductor device is mounted on a circuit board.

The dicing step involves cutting the outer lead 30 formed of the plated layer 1, and hence nickel or copper is exposed from the end surface 31 as a cutting surface. FIG. 11 is a cross-sectional view illustrating a state in which the semiconductor package manufactured by the related-art manufacturing method is bonded on a circuit board 13 with solder 11. Because a gold plated layer or a silver plated layer is exposed from a bottom surface 32 of the outer lead 30, solder wettability is good and a satisfactory bonded state with solder is obtained (see, for example, Japanese Patent Application Laid-open No. 2002-9196).

Further, a technology of forming a material with good solderability on a cutting surface of an outer lead in a related-art gullwing type semiconductor package is disclosed in Japanese Patent Application Laid-open Nos. Hei 8-213540 and Hei 7-030043.

As described above, more and more packaged semiconductor devices have employed the flat type due to the thinning, downsizing, and lightening of electronic devices.

In the structure illustrated in FIG. 11, however, the main material of the plated layer 1 such as nickel or copper is exposed on the end surface 31 of the outer lead 30, and hence solder wettability is poor and it is difficult to bond the semiconductor package with solder. Accordingly, as illustrated in FIG. 11, a good solder fillet cannot be obtained from the end surface 31 and hence a sufficient bonding area cannot be obtained in bonding with the circuit board, thus resulting in a problem of low bonding strength. Further, automatic visual inspection using image inspection, which is performed after the semiconductor package is bonded on the circuit board with solder, determines a pass/fail of a connection state between the outer lead 30 and solder 11 by observing the shape of the fillet. However, because the solder fillet is not bonded on the end surface 31 of the outer lead 30, a pass/fail of the connection state cannot be determined simply by observing the fillet. Thus, there is another problem in that automatic visual inspection cannot be applied to the flat package.

SUMMARY OF THE INVENTION

The present invention aims to solve the problems inherent in the related-art flat package as described above, and it is an object thereof to provide a packaged semiconductor device that is capable of forming a good solder fillet at a solder bonding portion to have high bond strength with a circuit board and is compatible with automatic visual inspection.

In order to solve the above-mentioned problems, the following measures are used.

First, there is provided a semiconductor device, including: a semiconductor chip mounted on an island; an encapsulation resin for covering the semiconductor chip; and a lead that is partially covered with the encapsulation resin and is electrically connected to the semiconductor chip, in which an end surface of the lead, which is exposed from the encapsulation resin, is covered with a plated layer, and a side end surface of the plated layer and a side end surface of the encapsulation resin are flush with each other.

Further, there is provided a method of manufacturing a semiconductor device, including: forming a first resist pattern having a predetermined pattern on a conductive base plate; forming an island and a lead by precipitating a first plated layer by an electrolytic plating method on an opening surface of the conductive base plate except for a region of the first resist pattern; applying a photo resist on a surface of the first resist pattern and a surface of the first plated layer; forming a second resist pattern having an air gap at an end surface of the lead by removing a part of the first resist pattern and a part of the photo resist; precipitating a second plated layer in the air gap to form a plated layer on the end surface of the lead; removing the second resist pattern; mounting a semiconductor chip on the island, and connecting the semiconductor chip and the lead to each other via a wire; covering the semiconductor chip, the wire, the lead, and the second plated layer, which are formed on the conductive base plate, with an encapsulation resin having insulating property; separating the conductive base plate from the encapsulation resin, the island, the lead, and the second plated layer; and singulating the semiconductor device by cutting the encapsulation resin and a center part of the second plated layer.

Further, there is provided a method of manufacturing a semiconductor device, including: forming a first resist pattern having a predetermined pattern on a conductive base plate; forming leads by precipitating first plated layers by an electrolytic plating method on opening surfaces of the conductive base plate except for a region of the first resist pattern; forming a first encapsulation resin having insulating property so as to fill a space between the leads; separating the conductive base plate from the first encapsulation resin and the first plated layer; forming photo resists on both surfaces of a member formed of the first encapsulation resin and the first plated layer, and removing the photo resist on a first surface of the first plated layer on one side, to thereby form a photo resist removed portion; forming an air gap by partially removing the photo resists and the first encapsulation resin so as to expose an end surface of the first plated layer; precipitating a second plated layer in the air gap and on the photo resist removed portion to form a plated layer on an end surface of each of the leads; removing a remaining part of the photo resists; reversing a member formed of the first encapsulation resin, the first plated layer, and the second plated layer, mounting a semiconductor chip on a surface of the first encapsulation resin serving as an island portion, and connecting the semiconductor chip and the each of the leads to each other via a wire; covering the semiconductor chip, the wire, the leads, and the second plated layer, which are formed on the first encapsulation resin, with a second encapsulation resin having insulating property; and singulating the semiconductor device by cutting the second encapsulation resin and a center part of the second plated layer.

By using the above-mentioned measures, a good solder fillet can be formed at the end surface of the outer lead of the flat package when the semiconductor package is mounted on a circuit board, and hence the bonding strength with the circuit board is improved. Besides, a pass/fail determination on bonding between the semiconductor package and the circuit board can be performed even by an automatic visual inspection based on observation of the solder fillet.

DETAILED DESCRIPTION OF THE PREFERRED EMBODIMENTS

Now, embodiments of the present invention are described in detail with reference to the accompanying drawings.

Figure 1:
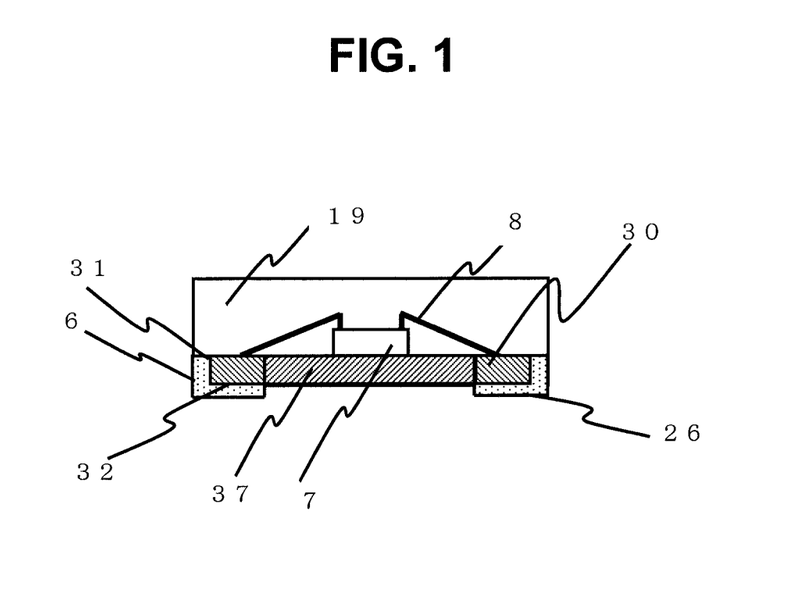
FIG. 1 is a cross-sectional view illustrating a semiconductor device according to a first embodiment of the present invention.

FIG. 1 is a cross-sectional view of a semiconductor device according to a first embodiment of the present invention.

The semiconductor device according to the present invention includes a semiconductor chip 7, an outer lead 30, a wire 8 for electrically connecting the semiconductor chip 7 and the outer lead 30 to each other, an island portion encapsulation resin 37 for mounting the semiconductor chip 7 thereon, a plated layer 6 formed to cover an end surface 31 of the outer lead 30, and an encapsulation resin 19 for protecting the whole semiconductor device. As illustrated in FIG. 1, the lead 30 has a top surface (where the wire 8 is connected), a bottom surface and side surfaces that interconnect the top and bottom surfaces, and the end surface 31 constitute the outer one of the side surfaces and faces outwardly away from the semiconductor chip 7.

The feature of the present invention resides in that the plated layer 6 is formed in contact with the end surface 31 of the outer lead 30 and the plated layer 6 does not substantially protrude from external dimensions of the semiconductor device. In other words, a side end surface of the plated layer 6 and a side end surface of the encapsulation resin 19 are flush with each other.

Further, in FIG. 1, a plated layer 26 is subsequently formed also on a bottom surface 32 of the outer lead 30, to thereby form a standoff on a lower surface of the island. It is, however, not always necessary to subsequently form the plated layer 26 on the outer lead bottom surface. If a plurality of plated layers are formed in advance at a stage of forming the outer lead 30 so that a plated layer with good solder wettability such as gold is formed on the lead bottom surface 32 that is to be brought into contact with solder, the semiconductor device can be soldered to a circuit board only with this plated layer. In this case, it is not necessary to subsequently form the plated layer 26.

FIGS. 2A to 2L are explanatory cross-sectional views of a manufacturing process for the semiconductor device according to the first embodiment of the present invention.

The known art is used in FIGS. 2A to 2D, and the feature of the method of manufacturing the semiconductor device according to the first embodiment is illustrated in FIGS. 2E to 2L.

Figure 2A:
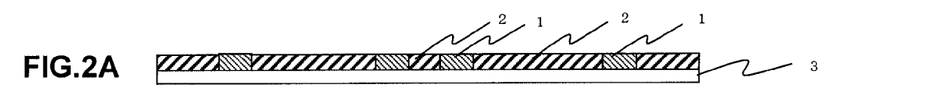
FIGS. 2A to 2L are cross-sectional views illustrating a manufacturing process for the semiconductor device according to the first embodiment of the present invention.

FIG. 2A is a view in which a photo resist 2 is patterned on a conductive base plate 3, and a plated layer 1 is precipitated in an opening of the photo resist 2. The plated layer 1 has a double layer structure in which a nickel or copper plated layer is formed directly on a surface to be brought into contact with the conductive base plate 3, and a gold or silver plated layer is formed thereon. Alternatively, the plated layer 1 may have a triple layer structure in which a gold or silver plated layer with good solder wettability is formed on the conductive base plate 3, a nickel or copper plated layer is precipitated thereon, and a gold or silver plated layer or the like is formed thereon.

Figure 2B:
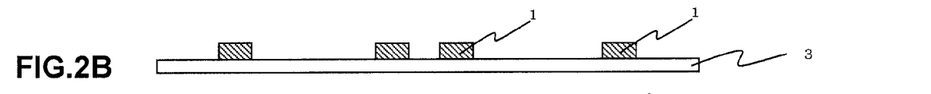
Figure 2C:
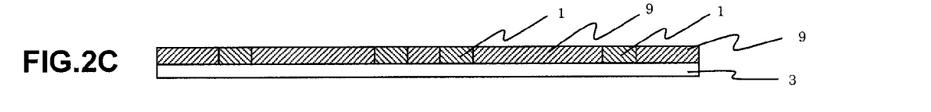
Figure 2D:
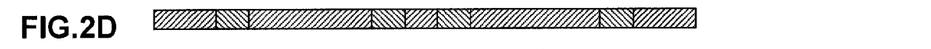

Referring to FIG. 2B, the photo resist 2 is removed. Referring to FIG. 2C, a component obtained by forming the plated layer 1 on the conductive base plate 3 is encapsulated with a resin to form an encapsulation resin layer 9. The encapsulation resin layer 9 fills an air gap around the plated layer 1. Referring to FIG. 2D, the conductive base plate 3 on the lower surface is removed.

Figure 2E:
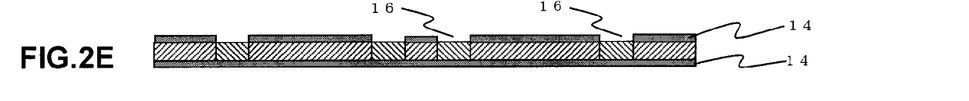
Figure 2F:
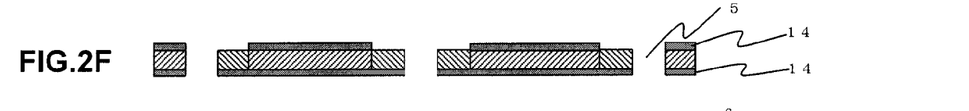

Referring to FIG. 2E, photo resists 14 are applied on the front and rear surfaces of a component obtained by integrating the encapsulation resin layer 9 and the plated layer 1, and the photo resist applied on one-side surface of the plated layer 1 is removed. A photo resist removed portion is represented by reference numeral 16. Referring to FIG. 2F, the photo resist 14 and the encapsulation resin layer 9 are partially removed so as to expose an end surface of the plated layer 1, to thereby form an air gap 5.

Figure 2G:
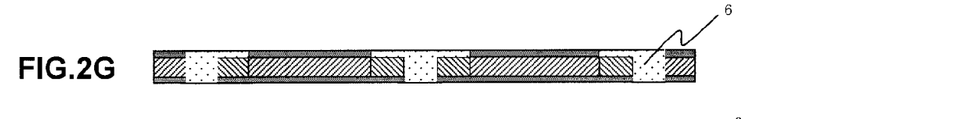

Available methods for removing the photo resist 14 and the encapsulation resin layer 9 in this step include laser irradiation, punching with a die, and dicing. Referring to FIG. 2G, plating is performed to form a plated layer 6 in the air gap 5 formed in the previous step. Available plating performed in this step includes tin-based plating and gold plating, which exhibit good solderability.

Figure 2H:
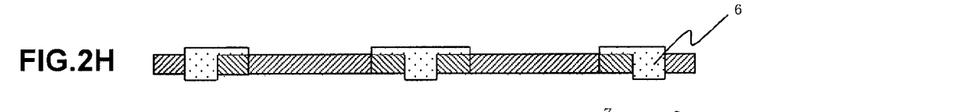
Figure 2I:
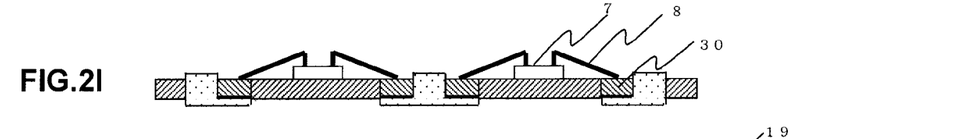

Referring to FIG. 2H, the photo resists 14 are removed. Referring to FIG. 2I, a component completed in the previous step is reversed (vertically), the semiconductor chip 7 is die-bonded on the encapsulation resin layer 9, and further the semiconductor chip 7 and the outer lead 30 formed of the plated layer 1 are electrically connected to each other via the wire 8. In the die-bonding step, the semiconductor chip can be bonded with use of insulating paste or conductive paste.

Figures 2J, 2K:
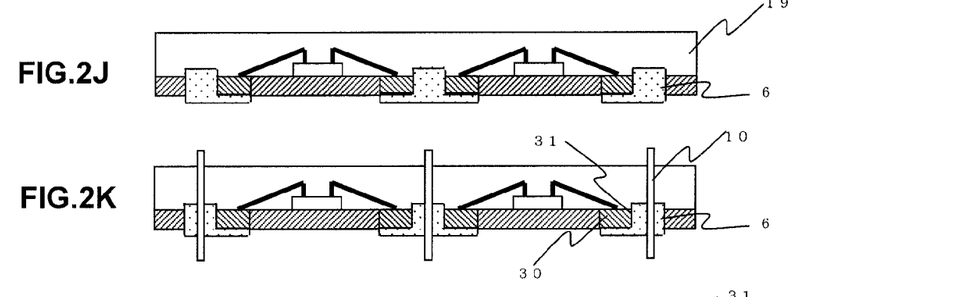
Figure 2L:
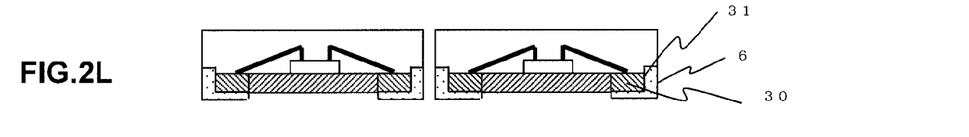

Referring to FIG. 2J, the whole semiconductor package is covered with an encapsulation resin layer 19 in order to protect the semiconductor chip 7 and the wire 8. FIG. 2K illustrates a step of singulating the semiconductor package by dicing with a dicing plate 10. It is important to cut a center part of the plated layer 6 so that the plated layer 6 may remain on the end surface 31 of the outer lead 30. Referring to FIG. 2L, the semiconductor packages are finally singulated. Through the process described above, the semiconductor device illustrated in FIG. 1 is completed.

FIGS. 3A to 3J illustrate a manufacturing method according to a second embodiment of the present invention.

Figure 3A:
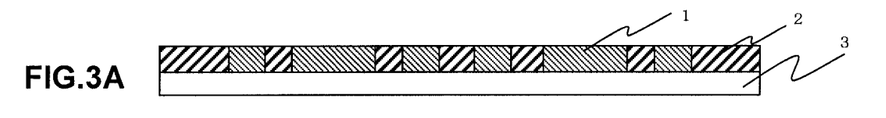
FIGS. 3A to 3J are cross-sectional views illustrating a manufacturing process for a semiconductor device according to a second embodiment of the present invention.

Referring to FIG. 3A, a photo resist 2 is patterned on a conductive base plate 3, and a plated layer 1 is formed in an opening of the photo resist 2. In many cases, the plated layer 1 is formed as follows. A gold or silver plated layer with good solder wettability is formed on the conductive base plate 3, a nickel or copper plated layer serving as a main material of an electrode of the semiconductor package is formed thereon, and further a gold or silver plated layer is formed thereon for ensuring good wire bonding. In other words, the plated layer 1 has a triple layer structure in which the gold plated layer is formed on the conductive base plate 3 as a first plated layer, the nickel or copper plated layer is formed thereon, and the gold or silver plated layer is formed on the uppermost surface.

Figure 3B:
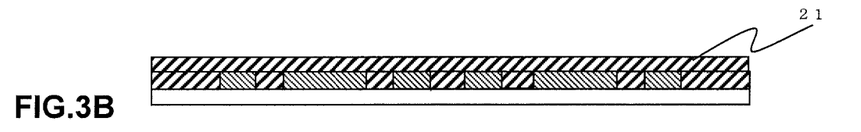
Figure 3C:
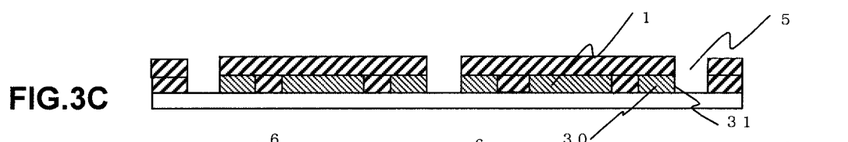
Figure 3D:
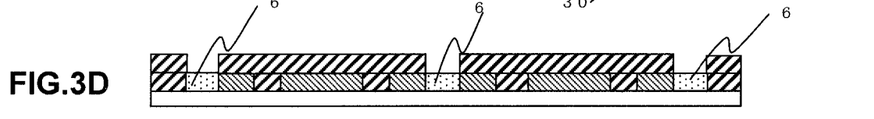
Figure 3E:
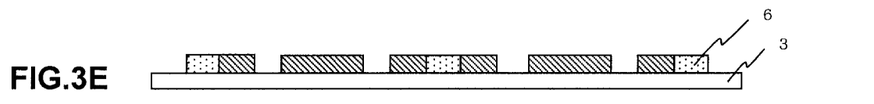

Referring to FIG. 3B, a photo resist 21 is further applied on a surface of the plated layer 1 and a surface of the photo resist 2 that are formed on the conductive base plate 3 in the previous step. Referring to FIG. 3C, the photo resist 2 and the photo resist 21 are partially removed so as to expose an end surface 31 of a region of the plated layer 1 serving as an outer lead 30. The photo resists can be removed by etching with a chemical solution, laser irradiation, or other such methods. Referring to FIG. 3D, the region from which the photo resists are removed in the previous step is subjected to plating to from a plated layer 6. A material with good solder wettability is used for the plated layer 6. For example, gold plating or tin-based solder plating is suitable. Referring to FIG. 3E, the photo resists 2 and 21 that have served as a mask in the previous plating step are removed. The structure of the semiconductor package is defined at the end of this step, and an island 36 for mounting a semiconductor chip thereon in a subsequent step, the outer lead 30, and the plated layer 6 formed on the end surface thereof are formed on the conductive base plate 3.

Figure 3F:
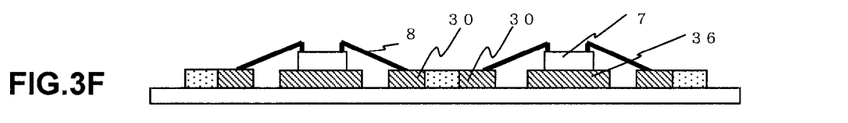
Figure 3G:
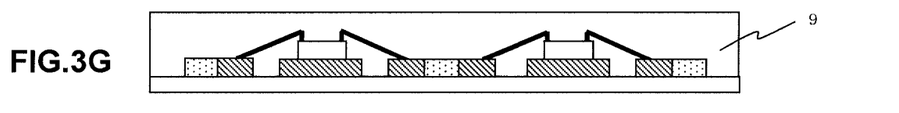
Figure 3H:
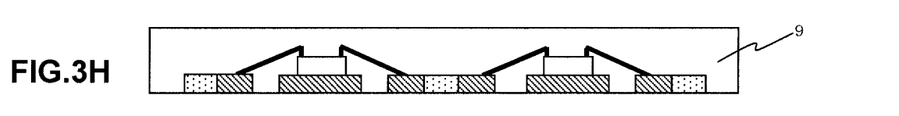
Figure 3I:
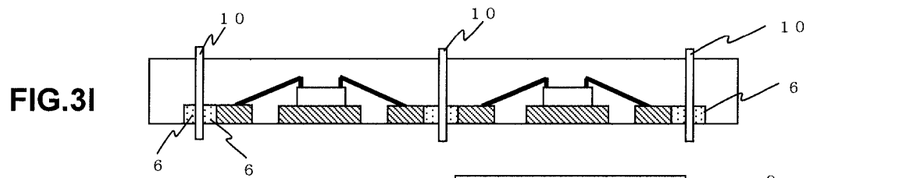
Figure 3J:
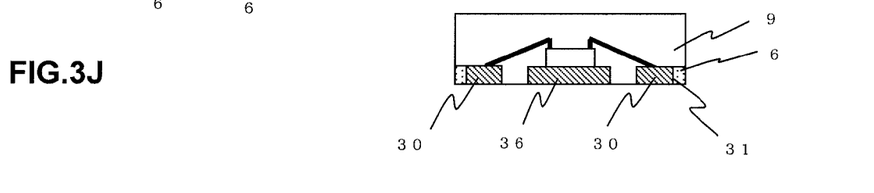

Referring to FIG. 3F, a semiconductor chip 7 is mounted on the island 36, and is electrically connected to the outer lead 30 via a wire 8. Referring to FIG. 3G, the whole semiconductor package is covered with an encapsulation resin layer 9 in order to protect the semiconductor chip 7 and the wire 8. Referring to FIG. 3H, the conductive base plate 3 is separated. FIG. 3I illustrates a dicing step of singulating the semiconductor package by a blade 10. What is important in this step is to divide a center part of the plated layer 6 so that the plated layer 6 may remain on the end surface of the outer lead 30. FIG. 3J illustrates the final form of the singulated semiconductor package. Through the process described above, the plated layer 6 made of a tin-based or gold material can be formed on the end surface 31 of the outer lead 30, and further a bottom surface 32 of the outer lead 30 is a gold or silver plated layer with good solder wettability.

FIGS. 4A to 4E illustrate a manufacturing method according to a third embodiment of the present invention. After the common process of FIGS. 3A to 3H, a material with good solder wettability is formed also on a bottom surface of the outer lead 30 and a bottom surface of the island 36. However, in the case where a semiconductor package is manufactured by the process illustrated in FIGS. 4A to 4E, the plated layer 1 to be formed in the step of FIG. 3A is not required to have a triple layer structure. It is only necessary to form a nickel or copper plated layer directly on the conductive base plate 3 and to form a gold or silver plated layer thereon. In other words, the plated layer 1 may have a double structure in which a gold or silver plated layer is formed on a bonding surface with a wire in order to bond the wire 8 and the outer lead 30 to each other.

Figures 4A, 4B:
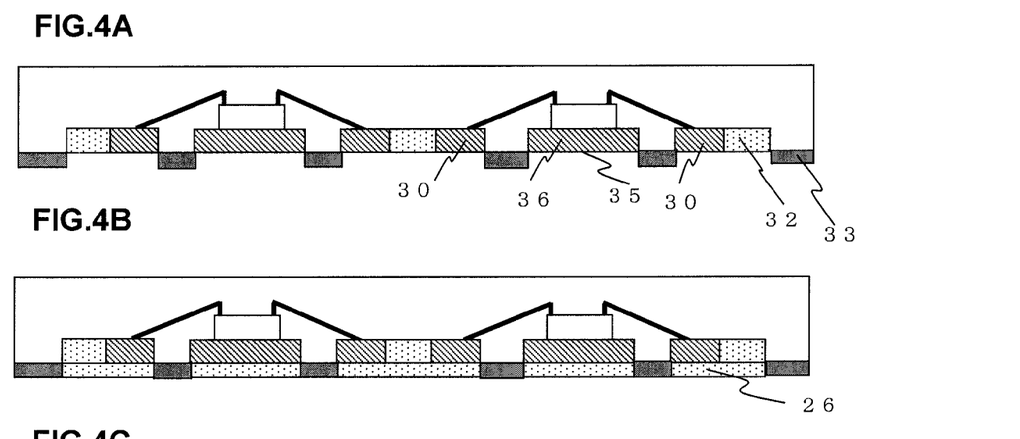
FIGS. 4A to 4E are cross-sectional views illustrating a manufacturing process for a semiconductor device according to a third embodiment of the present invention.
Figure 4C:
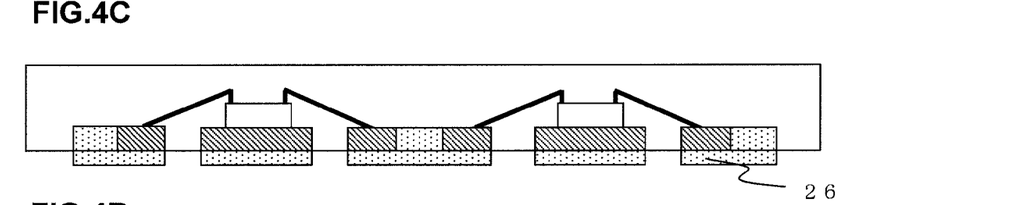
Figure 4D:
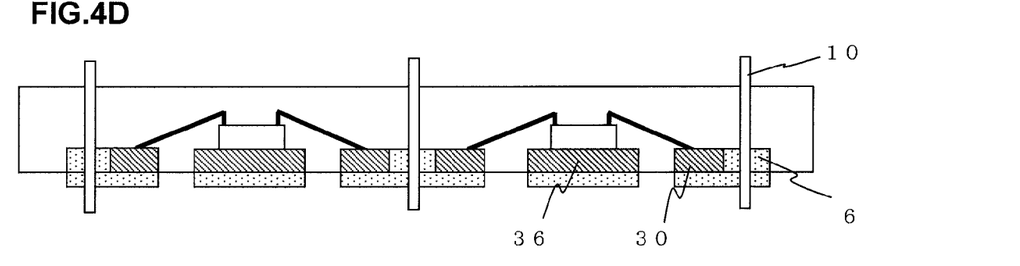
Figure 4E:
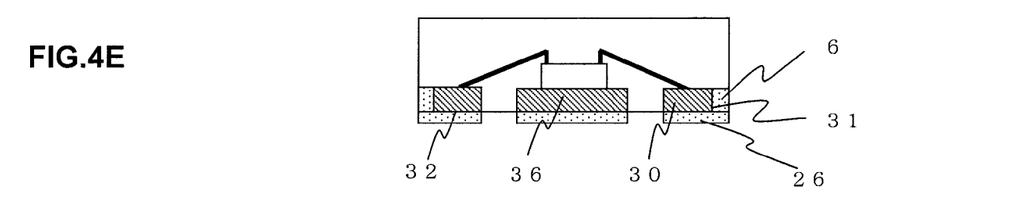

Referring to FIG. 4A, a photo resist 33 is patterned in order to form a plated layer on the bottom surface 32 of the outer lead 30 and a bottom surface 35 of the island 36. Referring to FIG. 4B, a plated layer 26 is formed in an opening of the patterned photo resist 33. Referring to FIG. 4C, the photo resist 33 is removed. The plated layer 26 is shaped to protrude from a bottom surface of the encapsulation resin layer 9, and can serve also as a standoff of the semiconductor package. The formation of the standoff facilitates self-alignment when the semiconductor package is mounted on a circuit board. FIG. 4D illustrates a step of singulating the semiconductor package by the blade 10 for the dicing step similarly to FIG. 3I. What is important in this step is to divide an inner side of the plated layer 6 so that the plated layer 6 may remain on the end surface 31 of the outer lead 30. FIG. 4E is a cross-sectional view of the semiconductor package finally completed through the process of the present invention. The feature of this structure resides in that the plated layer 6 and the plated layer 26 each formed of the material with good solder wettability are formed on the end surface 31 and the bottom surface 32 of the outer lead 30, respectively.

FIGS. 5A to 5D and FIGS. 6E to 6G are top views for facilitating the understanding of a part of the process of FIGS. 3A to 3J.

Figure 5A:
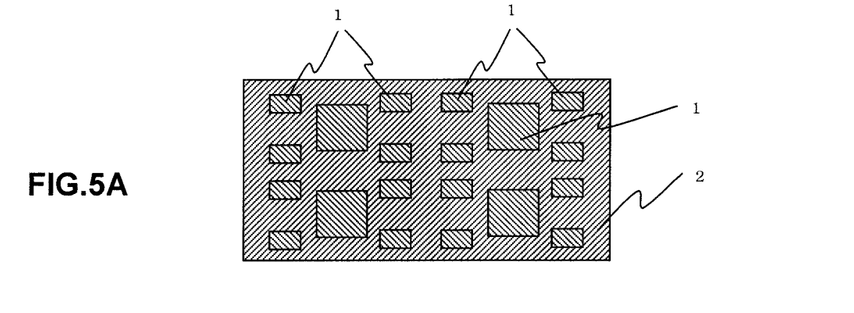
FIGS. 5A to 5D are top views illustrating the manufacturing process for the semiconductor device according to the third embodiment of the present invention.
Figure 5B:
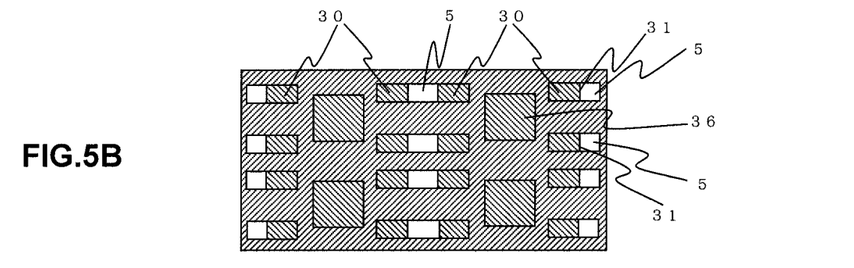
Figure 5C:
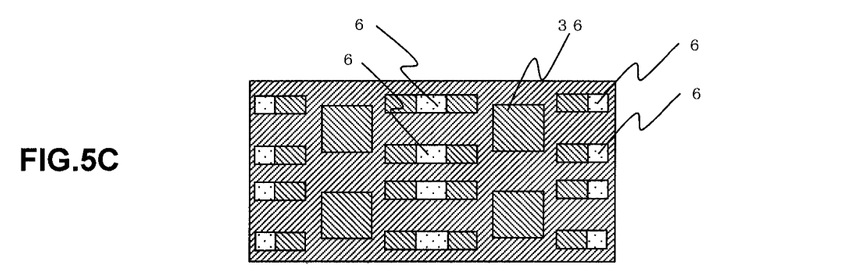
Figure 5D:
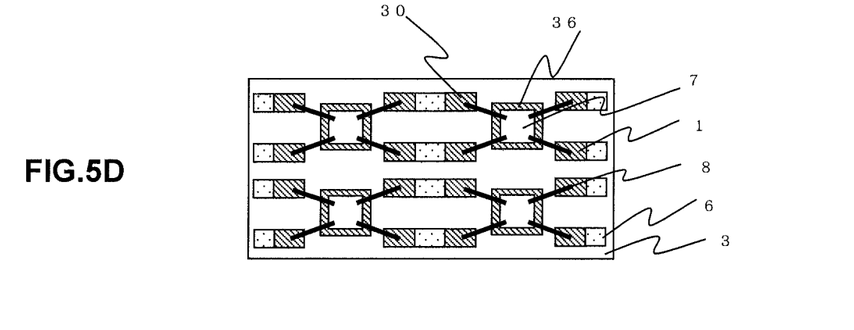

FIG. 5A is a top view of FIG. 3A. The plated layer 1 is formed in accordance with the shape of the patterned photo resist 2. The plated layer 1 serves as the island portion for mounting the semiconductor chip thereon and the outer lead when the semiconductor package is completed. FIG. 5B is a top view of FIG. 3C. In order to expose the end surface 31 of the outer lead 30, the photo resist and the encapsulation resin layer are removed to form the air gap 5. It is desired that the air gap 5 be formed only in a region in contact with the end surface 31 of the outer lead 30, but it is not desired that the end surfaces of adjacent outer leads be connected to each other via the air gap 5. FIG. 5C is a top view of FIG. 3D. Plating is performed to form the plated layer 6 in the air gap 5. The plated layer 6 needs to be formed of a material with good solder wettability. FIG. 5D illustrates a state in which the photo resist 2 is removed and the semiconductor chip 7 is mounted on the island 30 and connected to the outer lead 30 via the wire 8.

Figure 6A:
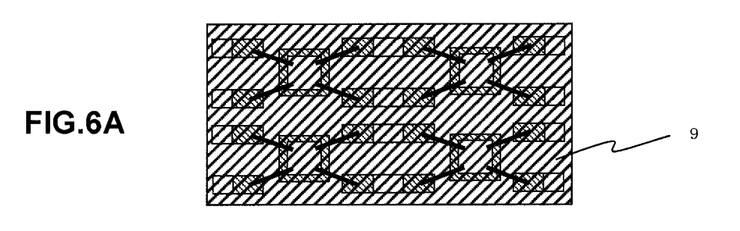
FIGS. 6A to 6C are top views illustrating the manufacturing process for the semiconductor device according to the third embodiment of the present invention followed by FIGS. 5A to 5D.
Figure 6B:
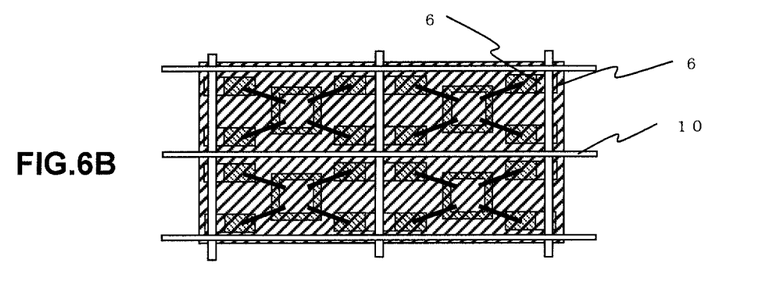
Figure 6C:
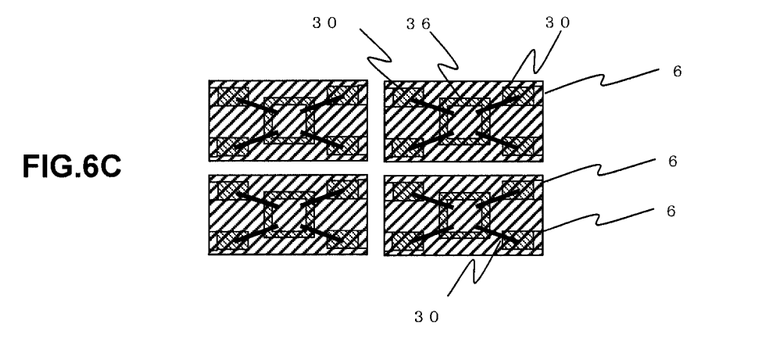

Referring to FIG. 6A, the whole semiconductor package is covered with the encapsulation resin layer 9. Referring to FIG. 6B, the semiconductor package is singulated by the dicing blade 10 similarly to FIG. 3I. What is important in this step is to cut the plated layer 6 formed of the material with good solder wettability so that the plated layer 6 may remain on the end surface 31 of the outer lead 30. Through the process described above, the singulated semiconductor packages as illustrated in FIG. 6C are completed.

Figure 7:
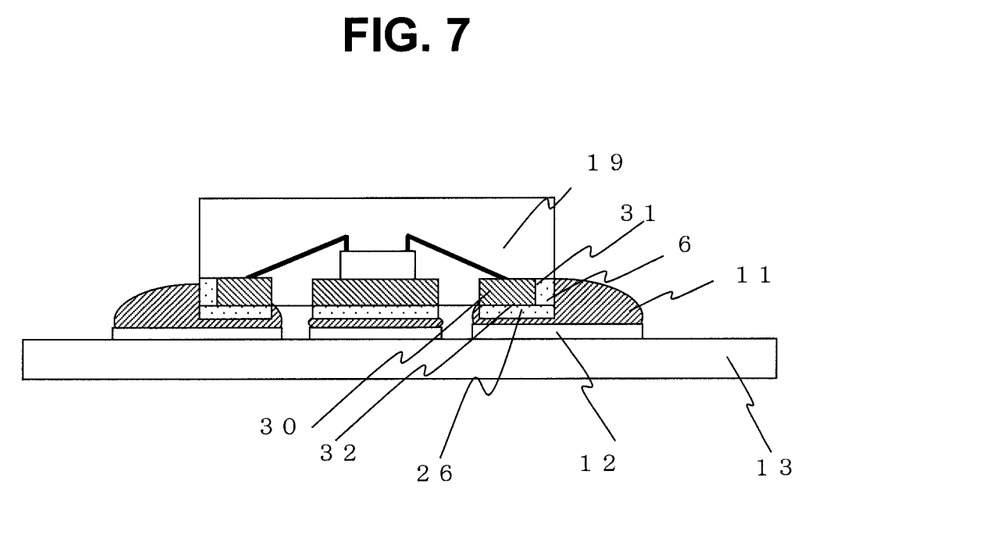
FIG. 7 is a cross-sectional view illustrating a state in which the semiconductor device according to the first embodiment of the present invention is mounted on a circuit board.

FIG. 7 is a cross-sectional view illustrating a state in which the semiconductor package manufactured through the process of FIGS. 4A to 4E is bonded on a circuit board 13 with solder 11. Solder 11 wets well on the plated layer 6 formed on the end surface 31 of the outer lead 30, and a good fillet is formed. The plated layer 26 is formed also on the bottom surface 32 of the outer lead 30, thus facilitating bonding with the solder 11. Automatic visual inspection using image inspection, which is performed after the semiconductor package is bonded on the circuit board with solder, determines a pass/fail of a connection state between the outer lead 30 and the solder 11 by observing the shape of the fillet. Because the solder fillet 11 is formed on the end surface 31 of the outer lead 30, the connection state can be easily inspected by the automatic visual inspection.

Figure 8:
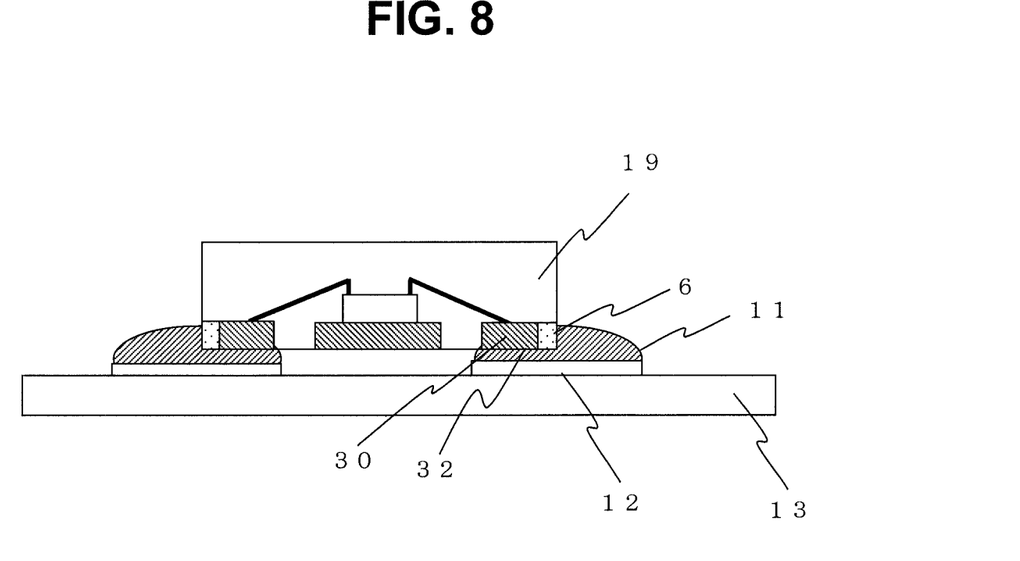
FIG. 8 is a cross-sectional view illustrating a state in which the semiconductor device according to the second embodiment of the present invention is mounted on a circuit board.

FIG. 8 is a cross-sectional view illustrating a state in which the semiconductor package manufactured through the process of FIGS. 3A to 3J is bonded on a circuit board 13 with solder 11. Similarly to FIG. 7, solder 11 wets well on the plated layer 6 formed on the end surface 31 of the outer lead 30, and a good fillet is formed. Further, in the case of this embodiment, the post-formed plated layer 26 is not formed on the bottom surface 32 of the outer lead 30, but as described above with reference to FIG. 3A, solder bondability is good because the plated layer with good solder wettability is formed in advance.

Figure 9:
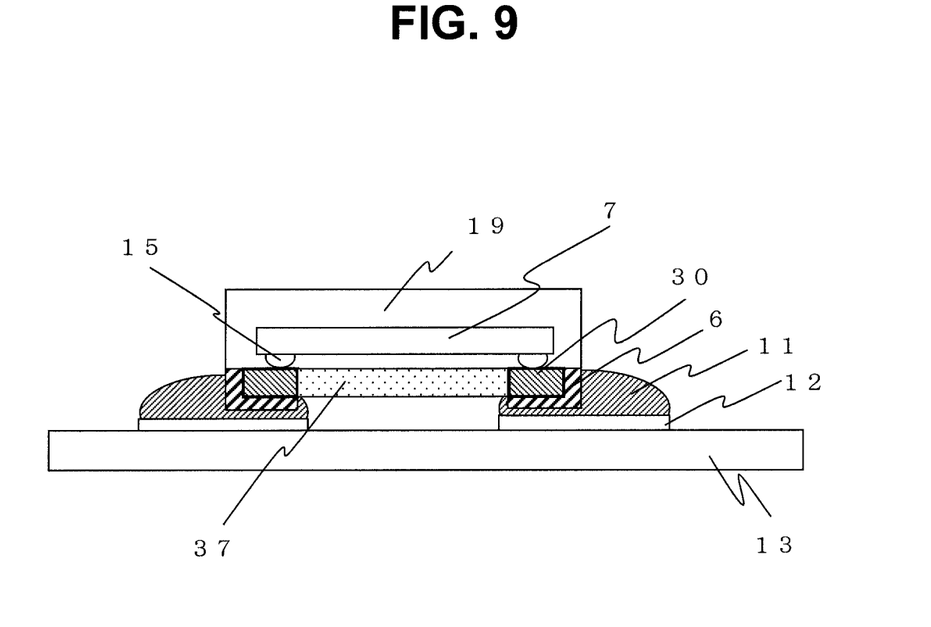
FIG. 9 is a cross-sectional view illustrating a state in which the semiconductor device according to the second embodiment of the present invention is mounted on a circuit board.

FIG. 9 illustrates a state in which the semiconductor package according to the second embodiment of the present invention is mounted on a circuit board. So-called flip chip bonding is performed, in which a bump 15 formed on the semiconductor chip 7 is bonded on the outer lead 30. In this manner, the semiconductor chip 7 and the outer lead 30 in the semiconductor package can be connected to each other via the bump 15 as well as the wire.

What is claimed is:

1. A semiconductor device, comprising:
   a semiconductor chip mounted on an island;
   an encapsulation resin for covering the semiconductor chip; and
   a lead that is partially covered with the encapsulation resin and is electrically connected to the semiconductor chip, the lead having an end surface all of which is spaced inwardly from a side end surface of the encapsulation resin; and
   a plated layer completely covering the end surface of the lead, a side end surface of the plated layer being flush with the side end surface of the encapsulation resin.

2. A semiconductor device according to claim 1, wherein the plated layer is formed also on a bottom surface of the lead to form a standoff on a lower surface of the island.

3. A semiconductor device according to claim 1, further comprising a bump formed on a surface of the semiconductor chip,
   wherein the semiconductor chip and the lead exposed from the encapsulation resin are electrically connected to each other via the bump.

4. A semiconductor device according to claim 1, wherein the end surface of the lead extends from a top surface of the lead to a bottom surface of the lead.

5. A semiconductor device according to claim 1, including a plurality of said leads.

6. A semiconductor device comprising:
   a semiconductor chip mounted on an island;
   leads electrically connected to the semiconductor chip, each lead having top and bottom surfaces and side surfaces interconnecting the top and bottom surfaces, the side surfaces including an outer end surface facing outwardly away from the semiconductor chip;
   an encapsulation resin covering the semiconductor chip and partially covering the leads, the outer end surfaces of the leads being completely exposed from and not covered by the encapsulation resin; and
   a plated layer formed on and completely covering the outer end surfaces of the leads, the plated layer being flush with a side surface of the encapsulation resin.

7. A semiconductor device according to claim 6, wherein the outer end surfaces of the leads are flat from the top surface to the bottom surface.

8. A semiconductor device according to claim 7, wherein the plated layer is also formed on the bottom surfaces of the leads.

9. A semiconductor device according to claim 8, wherein the plated layer on the bottom surfaces of the leads forms a standoff on a lower surface of the island.

10. A semiconductor device according to claim 6, wherein a bottom surface of the semiconductor chip is provided with electrically conductive bumps electrically connected to respective ones of the leads.

11. A semiconductor device according to claim 6, wherein the plated layer is also formed on the bottom surfaces of the leads.

12. A semiconductor device according to claim 11, wherein the plated layer on the bottom surfaces of the leads forms a standoff on a lower surface of the island.

* * * * *